United States Patent

Pierrat

[11] Patent Number: 5,851,734
[45] Date of Patent: Dec. 22, 1998

[54] PROCESS FOR DEFINING RESIST PATTERNS

[75] Inventor: Christophe Pierrat, Boise, Id.

[73] Assignee: Micron Technology, Inc., Boise, Id.

[21] Appl. No.: 626,666

[22] Filed: Mar. 26, 1996

[51] Int. Cl.⁶ ...................................................... G03F 7/20
[52] U.S. Cl. ........................... 430/312; 430/394; 430/396
[58] Field of Search ..................................... 430/311, 312, 430/322, 394, 396, 397

[56] References Cited

U.S. PATENT DOCUMENTS

| | | | |
|---|---|---|---|
| 5,045,417 | 9/1991 | Okamoto | 430/5 |
| 5,194,345 | 3/1993 | Rolfson | 430/5 |
| 5,194,346 | 3/1993 | Rolfson et al. | 430/5 |
| 5,281,500 | 1/1994 | Cathey et al. | 430/5 |
| 5,308,722 | 5/1994 | Nistler | 430/5 |
| 5,308,741 | 5/1994 | Kemp | 430/396 |

FOREIGN PATENT DOCUMENTS

| | | | |
|---|---|---|---|
| 3-1522 | 1/1991 | Japan | 430/394 |

*Primary Examiner*—Kathleen Duda
*Attorney, Agent, or Firm*—Fletcher, Yoder & Edwards

[57] ABSTRACT

A process for forming patterns in resist material on a semiconductor wafer that uses two masks to define a pattern instead of a single conventional mask to define the pattern. The present invention realizes better process latitude and resolution for a given feature size than did the prior art.

12 Claims, 3 Drawing Sheets

5,851,734

PROCESS FOR DEFINING RESIST PATTERNS

BACKGROUND OF THE INVENTION

1. Field of the Invention

The present invention relates to a process for use in the manufacture of integrated circuits, and, more particularly, to a process for defining a resist pattern on a wafer of semiconductor material.

2. Description of the Prior Art

Resist material is commonly used in processes for manufacturing integrated circuits. For example, resist material is deposited on a wafer of semiconductor material, and then patterned by exposing portions of it to ultraviolet light through a mask, where the mask contains the pattern (or the negative of the pattern) that is to be defined in the resist material. In the case of positive resist material, the exposed areas of the resist are chemically modified and degraded by the ultraviolet light. The entire wafer is then subjected to developer which attacks the exposed resist. The wafer is then rinsed, leaving only the unexposed resist on the wafer. Suitable additional procedures, may then be carried out with respect to the exposed areas of the wafer, such as etching an underlying material in the areas not protected by the unexposed resist. The unexposed resist is then removed, and the manufacturing process continues.

Referring to FIG. 1, a wafer 10 to which resist material 12 has been applied is shown. The wafer 10 may have been subjected to other procedures, e.g. doping, before the resist material 12 is applied. The usual method that is used to define a pattern in the resist is to project the image of a mask 14 onto the wafer that is covered with resist.

For ease of presentation, FIG. 1 illustrates a 1:1 correspondence between the features on the mask and the features defined in the resist material on the wafer. However, those skilled in the art will appreciate that the ratio between the features on a mask to the features on the wafer will vary according to modern lithography techniques from about 5:1 to 10:1.

In FIG. 1a, the mask 14, which may be formed of a quartz material 16, contains a chrome material 18 which has been deposited thereon and which specifies the pattern to be defined in the resist. When ultraviolet light from source 17 is passed through the mask, the resist material underlying the chrome 18 is not exposed to the ultraviolet light, while the resist material underlying areas of the mask where there is no chrome is exposed to ultraviolet light. If positive resist material is used, only resist line 12' of width W remains after development and rinsing as shown in FIG. 1b. If negative resist is used, a trench 19 of width W is formed in the resist material after development and rinsing as shown in FIG. 1c. Thus, the width of chrome area 18 of the mask 14 defines the width W of a pattern to be formed in resist 12.

In modern integrated circuits, the width of the resist patterns that are formed may be very small. It has been found that use of the process shown in FIG. 1 to form small patterns has limited the process latitude (dose and form) as well as the resolution to be achieved for the feature desired. The shortcomings of the prior art are avoided with the present invention.

SUMMARY OF THE INVENTION

In accordance with the present invention, a process that uses two masks for defining a resist pattern on a wafer is provided. One of the masks is used to define one edge of the pattern, while the other mask is used to define the other edge of the pattern. The overlap of opaque areas of the two masks define the width of the pattern. The two masks that are used have larger feature sizes than a single conventional mask, which leads to a better intensity profile on the wafer and a better process latitude and resolution for a given feature size.

BRIEF DESCRIPTION OF THE DRAWINGS

In the accompanying drawings:

FIG. 1, which comprises

FIG. 2, which comprises

DESCRIPTION OF SPECIFIC EMBODIMENTS

It will be appreciated that the present invention can take many forms and embodiments. Some embodiments of the invention are described so as to give an understanding of the invention. It is not intended, however, that the limited embodiments described herein should limit the invention.

The process of the present invention may be used with either positive or negative resist and comprises forming a pattern in the resist material by using two masks, instead of one as did the prior art. This process is illustrated in FIG. 2 where, as in FIG. 1, a 1:1 correspondence is shown between mask features and resist features for ease of presentation, with the understanding that the ratio of mask to resist features will typically be on the order of 5:1 to 10:1.

Figure 2A:
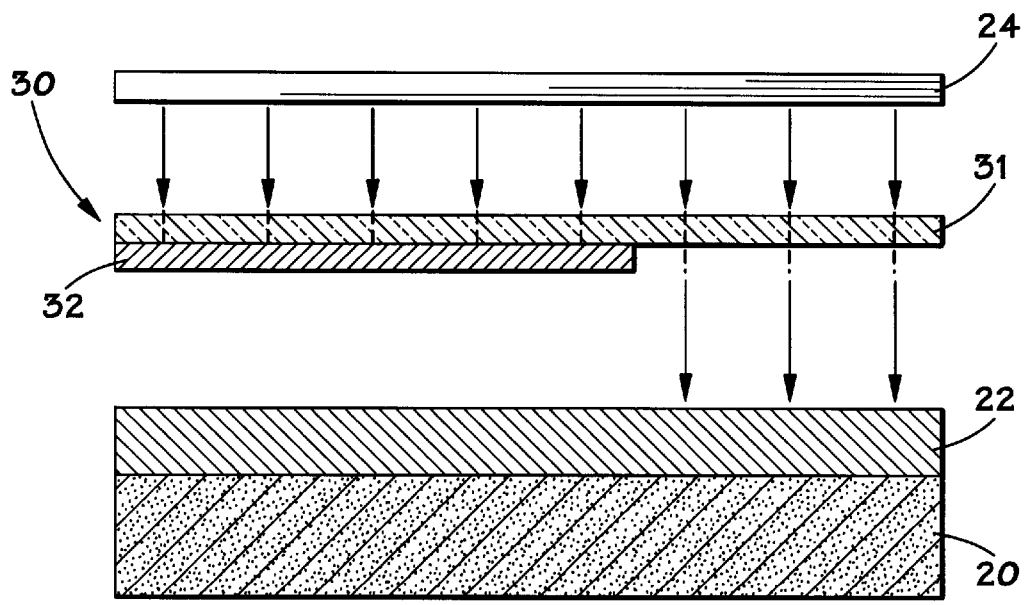
FIGS. 2a, 2b, 2c and 2d illustrates a process in accordance with the present invention for defining a pattern in resist material that has been deposited on a wafer of semiconductor material.

With reference first to FIG. 2a, the process of the present invention first comprises exposing a portion of resist material 22 by using a first mask 30. Mask 30 comprises quartz material 31 on which is deposited an opaque material 32, e.g., chrome. Mask 30 is interposed between a resist modifying source 24 and the wafer containing resist 22.

Resist modifying source 24 may, for example, be a source of electromagnetic radiation such as infrared light, ultraviolet light, visible light or X-rays. Alternatively, resist modifying source 24 may be an electron beam. When resist modifying source 24 is activated, the portion of resist material 22 that does not underlie opaque area 32 is exposed.

Figure 2B:
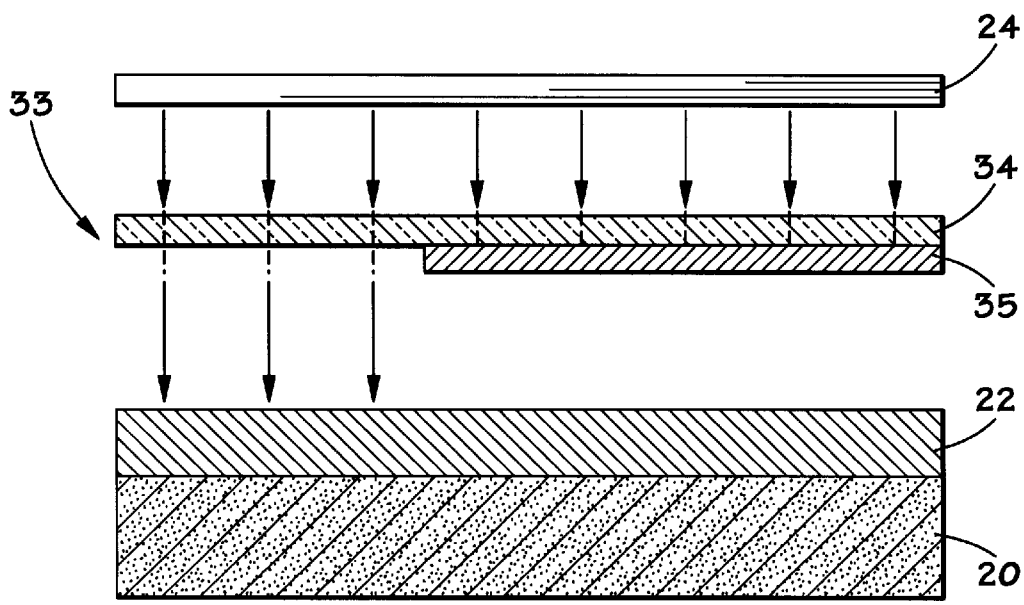

With reference to FIG. 2b, the process of the present invention next comprises exposing a second portion of resist material 22 by using mask 33. Mask 33 also comprises a quartz material 34 on which is deposited an opaque material 35 such as chrome. Mask 33 is interposed between resist modifying source 24 and the wafer containing the resist 22, as shown. When resist modifying source 24 is activated, the portion of the resist material 22 that does not underlie opaque area 35 is exposed.

Figure 2C:
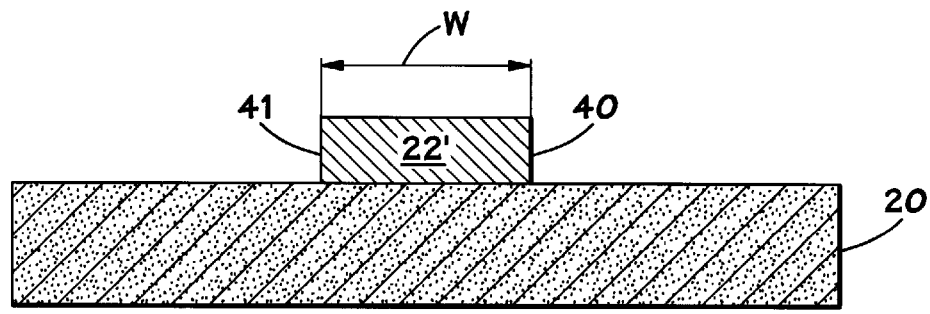
Figure 2D:
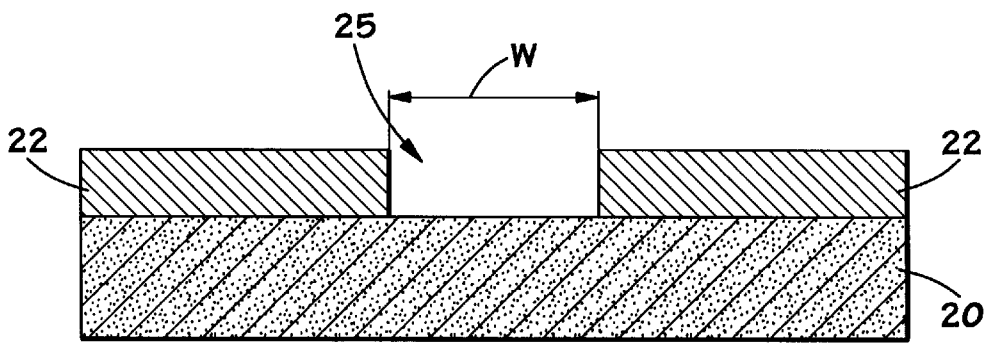

With reference now to FIG. 2c, if the resist material 22 is positive resist, only resist line 22' of width W remains after the wafer is subjected to a development and rinsing. Alternatively, if negative resist material is used, trench 25 having a width W will be formed in the resist material following development and rinsing, as shown in FIG. 2d. The first mask 30 is thus used to define one edge of the pattern formed in the resist material, while the second mask 33 is used to define the other edge of the remaining material. The width W of the pattern in the resist, whether that pattern is resist line 22' or the trench 25, is thus determined by the overlap in the opaque areas of the two masks 30, 33.

Figure 1A:
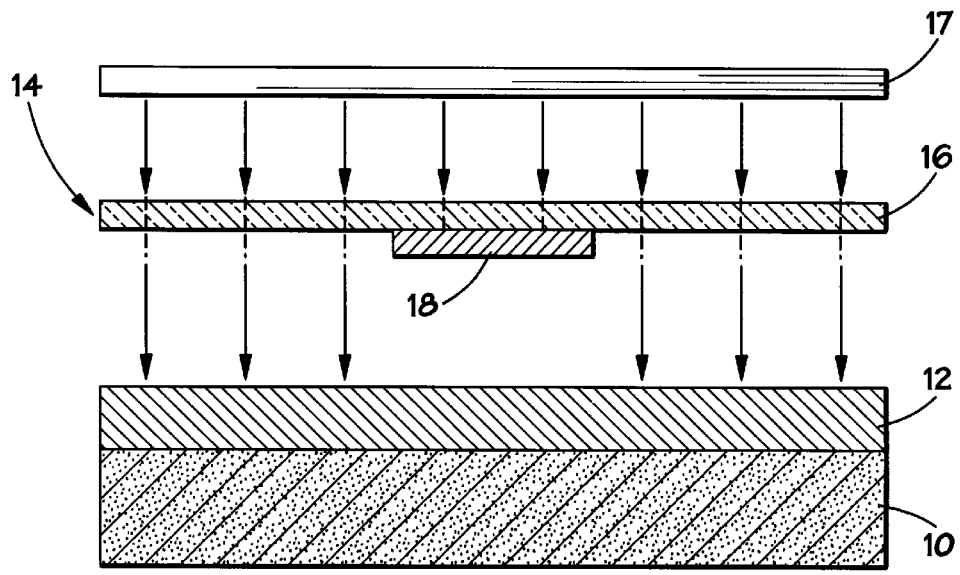
FIGS. 1a, 1b and 1c illustrates a prior art technique for defining a resist pattern on a wafer of semiconductor material.
Figure 1B:
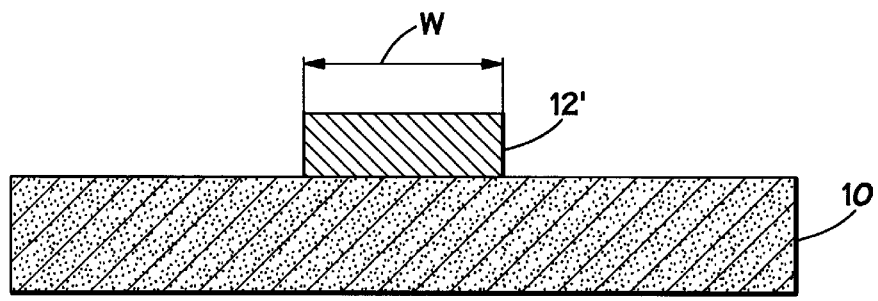
Figure 1C:
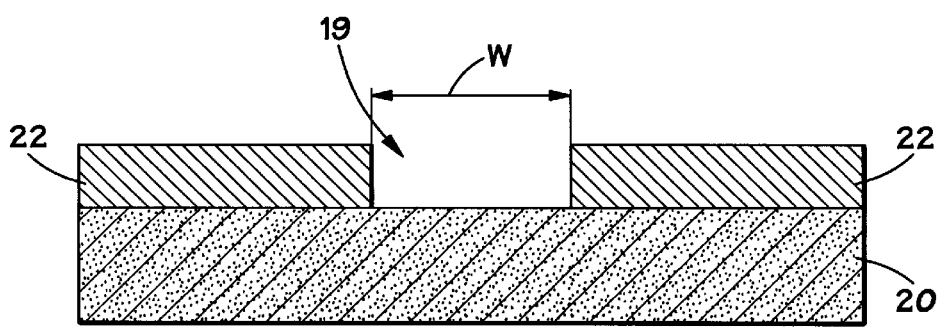

The two masks 30, 33 that are used have larger feature sizes than the conventional mask as shown in FIG. 1. As a result, the process of the present invention produces a better intensity profile on the wafer of semiconductor material and consequently a better process latitude and resolution for a given feature size than did prior art methods.

What is claimed is:

1. A process of defining a pattern of a desired width in resist material on a semiconductor wafer, comprising:

defining one edge of the pattern by exposing a first portion of the resist material to a resist modifying source through a first mask having first opaque portions; and defining another edge of the pattern by exposing a second portion of the resist material to a resist modifying source through a second different mask having second opaque portions, the opaque portions of the first and second masks overlapping by a distance correlative to the desired width of the pattern.

2. The process of claim 1, wherein positive resist material is used and the pattern which is produced is a resist line.

3. The process of claim 1, wherein negative resist material is used and the pattern which is produced is a trench.

4. A process of manufacturing a semiconductor device comprising:

depositing a resist material on a wafer of semiconductor material;

exposing a portion of the resist material to a resist modifying source through a first mask to define one edge of a desired pattern in the resist material; and exposing another portion of the resist material to a resist modifying source through a second different mask to define another edge of the desired pattern in the resist material, wherein opaque portions of the first and second masks overlap by a distance correlative to the desired width of the pattern.

5. The process of claim 4, wherein positive resist material is used and the pattern which is produced is a resist line.

6. The process of claim 4, wherein negative resist material is used and the pattern which is produced is a trench.

7. A method of defining a pattern having a width in resist material on a semiconductor wafer, the method comprising the steps of;

exposing a first portion of the resist material to a resist modifying source through a first mask to define a first edge of the pattern; and exposing a second portion of the resist material to a resist modifying source through a second different mask to define a second edge of the pattern, the second edge being spaced from the first edge by the width.

8. A method of creating a patter having a width in resist material on a semiconductor wafer, the method comprising the steps of:

modifying a first portion of the resist material using a first mask to define a first edge of the pattern;

modifying a second portion of the resist material using a second different mask to define a second edge of the pattern; and removing the first and second modified portions of the resist material to leave the pattern on the semiconductor wafer, wherein the first edge of the pattern and the second edge of the pattern are spaced apart by the width.

9. A method of defining a pattern having a width in resist material on a semiconductor wafer, the method comprising the steps of:

defining a first edge of the pattern by exposing a first portion of the resist material to a resist modifying source through a first mask; and defining a second edge of the pattern by exposing a second portion of the resist material to a resist modifying source through a second different mask, the second edge of the pattern being spaced from the first edge of the pattern by the width.

10. A method of defining a patter having a width in resist material on a semiconductor wafer, the method comprising the steps of:

providing a first mask, the first mask having a first transparent portion and a first opaque portion being sized and positioned to define a first portion of the pattern;

providing a second mask, the second different mask having a second transparent portion and a second opaque portion being sized and positioned to define a second portion of the pattern, the opaque portions of the first and second masks overlapping by a distance correlative to the width of the pattern;

placing the first mask over the resist material on the semiconductor wafer;

exposing a first portion of the resist material to a resist modifying source through the first mask;

removing the first mask, placing the second mask over the resist material on the semiconductor wafer; and exposing a second portion of the resist material to a resist modifying source through the second mask.

11. A method of defining a pattern having a width in resist material on a semiconductor wafer, the method comprising the steps of:

providing a first mask, the first mask having a first transparent portion and a first opaque portion being sized and positioned to define a first portion of the pattern;

providing a second different mask, the second mask having a second transparent portion and a second opaque portion being sized and positioned to define a second portion of the pattern, the opaque portions of the first and second masks overlapping by a distance correlative to the width of the pattern;

registering the first mask in a given position over the resist material on the semiconductor wafer;

exposing a first portion of the resist modifying source through the first mask;

removing the first mask;

registering the second mask in the given position over the resist material on the semiconductor wafer; and exposing a second portion of the resist material to a resist modifying source through the second mask.

12. A method of creating a pattern having a width in resist material on a semiconductor wafer, the method comprising the steps of:

providing a first mask, the first mask having a first transparent portion and a first opaque portion being sized and positioned to define a first portion of the pattern;

providing a second different mask, the second mask having a second transparent portion and a second opaque portion being sized and positioned to define a second portion of the pattern;

registering the first mask in a given position over the resist material on the semiconductor wafer;

modifying a first portion of the resist material by exposing the first portion of the resist material to a resist modifying source through the first mask to define a first edge of the pattern;

removing the first mask;

registering the second mask in the given position over the resist material on the semiconductor wafer;

modifying a second portion of the resist material by exposing the second portion of the resist material to a resist modifying source through the second mask to define a second edge of the pattern, the second edge being spaced from the first edge by the width; and removing the first and second modified portions of the resist material to leave the pattern on the semiconductor wafer.

* * * * *

UNITED STATES PATENT AND TRADEMARK OFFICE
CERTIFICATE OF CORRECTION

PATENT NO.    : 5,851,734                                              Page 1 of 1
DATED         : December 22, 1998
INVENTOR(S)   : Christophe Pierrat It is certified that error appears in the above-identified patent and that said Letters Patent is hereby corrected as shown below:

Column 1,
Please insert the following paragraph immediate after the title:

--GOVERNMENT LICENSE RIGHTS

The U.S. Government has a paid-up license in this invention and the rights in limited circumstances to require the patent owner to license others on reasonable terms as provided for the terms of Contract No. MDA972-92-0054 awarded by the Advanced Research Projects Agency (ARPA).--

Signed and Sealed this

Fifth Day of June, 2001

*Attest:*

*Attesting Officer*

NICHOLAS P. GODICI

*Acting Director of the United States Patent and Trademark Office*